(12) United States Patent
Branstad

(10) Patent No.: US 6,519,716 B1
(45) Date of Patent: Feb. 11, 2003

(54) ELECTRONIC DEVICE INITIALIZATION WITH DYNAMIC SELECTION OF ACCESS TIME FOR NON-VOLATILE MEMORY

(75) Inventor: Mark William Branstad, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,587

(22) Filed: Sep. 22, 1999

(51) Int. Cl.$^7$ ................................................ G06F 11/22
(52) U.S. Cl. ........................... 714/36; 714/47; 711/167; 713/2
(58) Field of Search ........................... 711/167; 714/36, 714/47; 713/1, 2

(56) References Cited

U.S. PATENT DOCUMENTS

| | | | |
|---|---|---|---|
| 4,063,308 A | 12/1977 | Collins et al. | 364/200 |
| 5,276,858 A | 1/1994 | Oak et al. | 395/550 |
| 5,504,877 A * | 4/1996 | Dornier | 711/167 |
| 5,809,340 A | 9/1998 | Bertone et al. | 395/878 |
| 6,088,774 A | 7/2000 | Gillingham | 711/167 |
| 6,154,428 A * | 11/2000 | Lee | 369/53.31 |
| 6,173,345 B1 | 1/2001 | Stevens | 710/100 |
| 6,266,749 B1 * | 7/2001 | Hashimoto et al. | 711/167 |
| 6,285,621 B1 * | 9/2001 | Beer | 365/226 |
| 6,334,174 B1 * | 12/2001 | Delp et al. | 711/167 |
| 6,438,670 B1 * | 8/2002 | McClannahan | 711/167 |

FOREIGN PATENT DOCUMENTS

| | | | |
|---|---|---|---|
| EP | 0 339 224 A2 | 11/1989 | G11C/7/00 |
| WO | WO 97/10538 | 3/1997 | G06F/1/04 |

* cited by examiner

*Primary Examiner*—Scott Baderman
(74) *Attorney, Agent, or Firm*—Wood, Herron & Evans L.L.P.

(57) ABSTRACT

A circuit arrangement and method of initializing an electronic device dynamically test a non-volatile memory prior to retrieving initialization program code to select an operational access time at which the initialization program code can be reliably retrieved from the non-volatile memory. Specifically, at least one test access is performed with the non-volatile memory to determine a satisfactory access time at which the non-volatile memory correctly processes the test access. Thereafter, initialization program code is retrieved from the non-volatile memory using an operational access time selected based upon the determined satisfactory access time. As such, through judicious selection of an appropriate operational access time, non-volatile memory devices having differing performance capabilities can be accessed in an optimal manner using the same memory control logic design, and without the need for specific customization or program code modifications.

20 Claims, 2 Drawing Sheets

ELECTRONIC DEVICE INITIALIZATION WITH DYNAMIC SELECTION OF ACCESS TIME FOR NON-VOLATILE MEMORY

FIELD OF THE INVENTION

The invention is generally related to the initialization of an electronic device such as an adaptor or other electronically controlled component in a data processing system, and in particular, to control over the retrieval of initialization code for execution by such an electronic device during initialization.

BACKGROUND OF THE INVENTION

Programmable electronic devices often require some degree of initialization upon power up, or in response to reset operations initiated on such devices, so that the devices can assume a known operational state. For example, one example of a programmable electronic device is a network adaptor card, used in a computer to interface the computer with an external network.

A network adaptor card in a computer needs to be initialized whenever the computer is first powered up. Also, if the computer supports power management functions, the network adaptor card may be shut down periodically when not in use, and may need to be initialized when brought out of its "sleeping" state. Some computers also support "hot swapping", whereby a network adaptor card may be removed and replaced while the computer is powered up, requiring the replacement card to be initialized upon installation in the computer.

Typically, a network adaptor card includes an embedded microcontroller that executes initialization program code during the initialization process. The initialization program code is stored in a non-volatile memory device, e.g., various types of read-only memory (ROM) solid state storage devices such as programmable read-only memories (PROM's), electrically programmable read-only memories (EPROM's), electrically erasable programmable read-only memories (EEPROM's), etc. During initialization, the microcontroller retrieves and executes the initialization program code to perform the various operations necessary to initialize the adaptor.

Given the ongoing need for greater performance, it is often desirable to minimize the amount of time it takes to initialize an electronic device. In particular, the time that a particular electronic device takes during initialization can impact the overall performance of other electronic components, e.g., a computer in which the device is installed. As an example, a multi-user computer such as an AS/400 midrange computer (available from International Business Machines Corporation) often includes a number of network adaptor cards, as well as other input/output adaptors such as workstation controllers, storage controllers, display adaptors, etc., all of which require initialization. Initialization of each device, as well as of the overall computer, may take as long as several minutes or more, and as a consequence, it is often desirable to minimize the amount of time it takes to initialize each programmable electronic device.

One factor affecting the initialization time for a programmable electronic device is the access time of the non-volatile memory within which the initialization program code for the device is stored. Any memory device will have a minimum access time at which the device can be reliably operated without error, and maximum performance is obtained when the control logic that accesses the memory operates using this minimum access time.

It may be desirable in some circumstances to replace the non-volatile memories used in some programmable devices, e.g., to repair a defective part, or to upgrade the initialization program code stored therein to correct programming errors or to introduce new functionality. Given that the performance of non-volatile memories, like many electronic components, continues to improve, a replacement non-volatile memory may be capable of faster operation than the part being replaced. However, if the control logic in an electronic device is specifically programmed to operate solely with the original, slower memory, the faster capability of the replacement device is essentially wasted.

Some conventional control logic designs are capable of being specifically configured to operate with different access times to accommodate different speeds of non-volatile memories. Such designs typically utilize programmable configuration bits to select an operational access time at which to access a non-volatile memory. However, programming of configuration bits typically requires changes to the microcode, thus necessitating a recompile, and increasing the difficulty and effort required to replace a non-volatile memory.

Therefore, a significant need continues to exist in the art for a manner of controlling an operational access time for a non-volatile memory to minimize initialization time in an electronic device.

SUMMARY

The invention addresses these and other problems associated with the prior art by providing a circuit arrangement and method of initializing an electronic device in which a non-volatile memory is dynamically tested prior to retrieving initialization program code to select an operational access time at which the initialization program code can be reliably retrieved from the non-volatile memory. Specifically, at least one test access is performed with the non-volatile memory to determine a satisfactory access time at which the non-volatile memory correctly processes the test access. Thereafter, initialization program code is retrieved from the non-volatile memory using an operational access time selected based upon the determined satisfactory access time. As such, through judicious selection of an appropriate operational access time, non-volatile memory devices having differing performance capabilities can be accessed in an optimal manner using the same memory control logic design, and without the need for specific customization or program code modifications.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The implementations of the invention discussed below generally improve the reliability and performance of an electronic device during initialization by optimizing the utilization of a non-volatile memory device in the retrieval of initialization program code used to initialize the electronic device. To do so, dynamic testing is performed to determine a satisfactory access time at which a non-volatile memory is successfully accessed. Then, an operational access time at which to access the non-volatile memory to retrieve initialization program code is selected based upon the determined satisfactory access time.

Oftentimes, the operational access time may be selected to be an optimal value for the particular non-volatile memory being used. Further, such selection may be made without the necessity for microcode changes, thereby facilitating upward compatibility of the electronic device.

A satisfactory access time is typically, but not exclusively, a minimum access time at which a non-volatile memory can be reliably accessed. Moreover, as will become more apparent below, the determination of a satisfactory access time may be performed directly, based upon an actual detection of a successful access. In the alternative, a determination of a satisfactory access time may be performed indirectly, based instead on a detection of an unsuccessful access. In the latter instance, for example, the satisfactory access time may be based upon the last successful access prior to detection of a first unsuccessful access.

The selection of an operational access time based upon the satisfactory access time may therefore be based upon an access time used in either a successful or an unsuccessful access. As will also become more apparent below, for example, it may be desirable to incorporate a safety margin into the operational access time used to subsequently retrieve initialization program code. The calculation of the operational access time may therefore be the sum of the desired safety margin and the access time used in either the last successful access or the first unsuccessful access. In other embodiments, however, the operational access time may simply be selected as the satisfactory access time determined from dynamic testing.

Other alternatives will be apparent to one of ordinary skill in the art.

Figure 1:
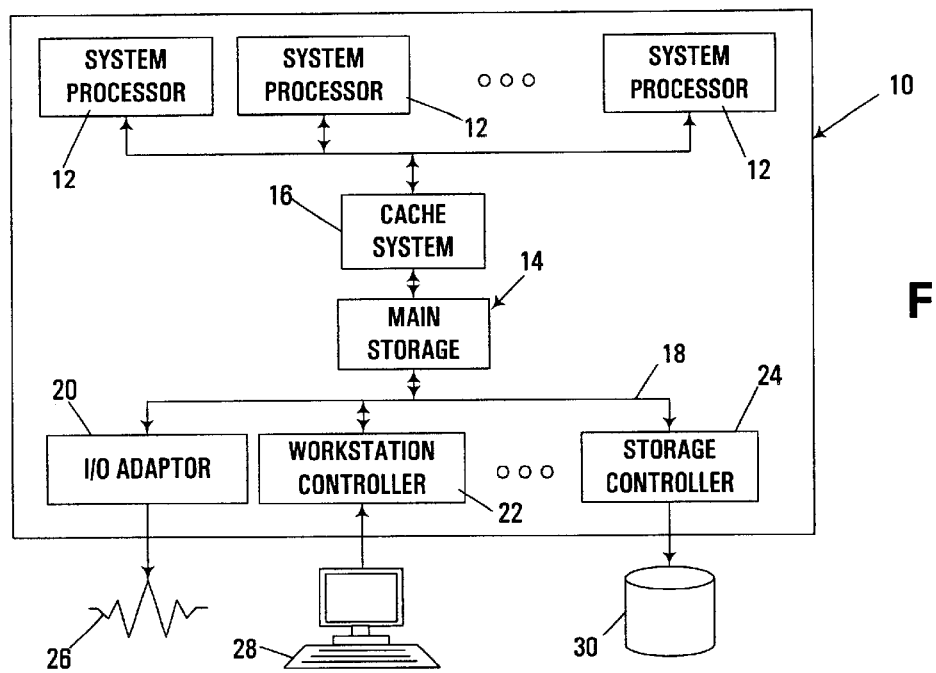
FIG. 1 is a block diagram of a data processing system consistent with the invention.

Turning to the Drawings, wherein like numbers denote like parts throughout the several views, FIG. 1 illustrates the general configuration of an exemplary data processing system 10 suitable for implementing a circuit arrangement consistent with the invention. System 10 generically represents, for example, any of a number of multi-user computer systems such as a network server, a midrange computer, a mainframe computer, etc. However, it should be appreciated that the invention may be implemented in other data processing systems, e.g., in stand-alone or single-user computer systems such as workstations, desktop computers, portable computers, and the like, or in other programmable electronic devices (e.g., incorporating embedded controllers and the like). One suitable implementation of data processing system 10 is in a midrange computer such as the AS/400 computer available from International Business Machines Corporation.

Data processing system 10 generally includes one or more system processors 12 coupled to a memory subsystem including main storage 14 and a cache system 16. Furthermore, main storage 14 is coupled to a number of types of external devices via a system input/output (I/O) bus 18 and a plurality of interface devices, e.g., an input/output adaptor 20, a workstation controller 22 and a storage controller 24, which respectively provide external access to one or more external networks 26, one or more workstations 28, and/or one or more storage devices such as a direct access storage device (DASD) 30.

It should be appreciated that data processing system 10 is merely representative of one suitable environment for use with the invention, and that the invention may be utilized in a multitude of other environments in the alternative. For example, dynamic memory testing can be incorporated in practically any electronic device incorporating non-volatile memory storage of initialization program code, whether or not interfaced with other electronic devices, or incorporated into a larger data processing system.

Dynamic memory testing consistent with the invention is typically implemented in a circuit arrangement disposed on one or more programmable integrated circuit devices. Moreover, as is well known in the art, integrated circuit devices are typically designed and fabricated using one or more computer data files, referred to herein as hardware definition programs, that define the layout of the circuit arrangements on the devices. The programs are typically generated by a design tool and are subsequently used during manufacturing to create the layout masks that define the circuit arrangements applied to a semiconductor wafer. Typically, the programs are provided in a predefined format using a hardware definition language (HDL) such as VHDL, verilog, EDIF, etc. While the invention has and hereinafter will be described in the context of circuit arrangements implemented in fully functioning integrated circuit devices and electronic devices and data processing systems utilizing such devices, those skilled in the art will appreciate that circuit arrangements consistent with the invention are capable of being distributed as program products in a variety of forms, and that the invention applies equally regardless of the particular type of signal bearing media used to actually carry out the distribution. Examples of signal bearing media include but are not limited to recordable type media such as volatile and non-volatile memory devices, floppy disks, hard disk drives, CD-ROM's, and DVD's, among others and transmission type media such as digital and analog communications links.

Figure 2:
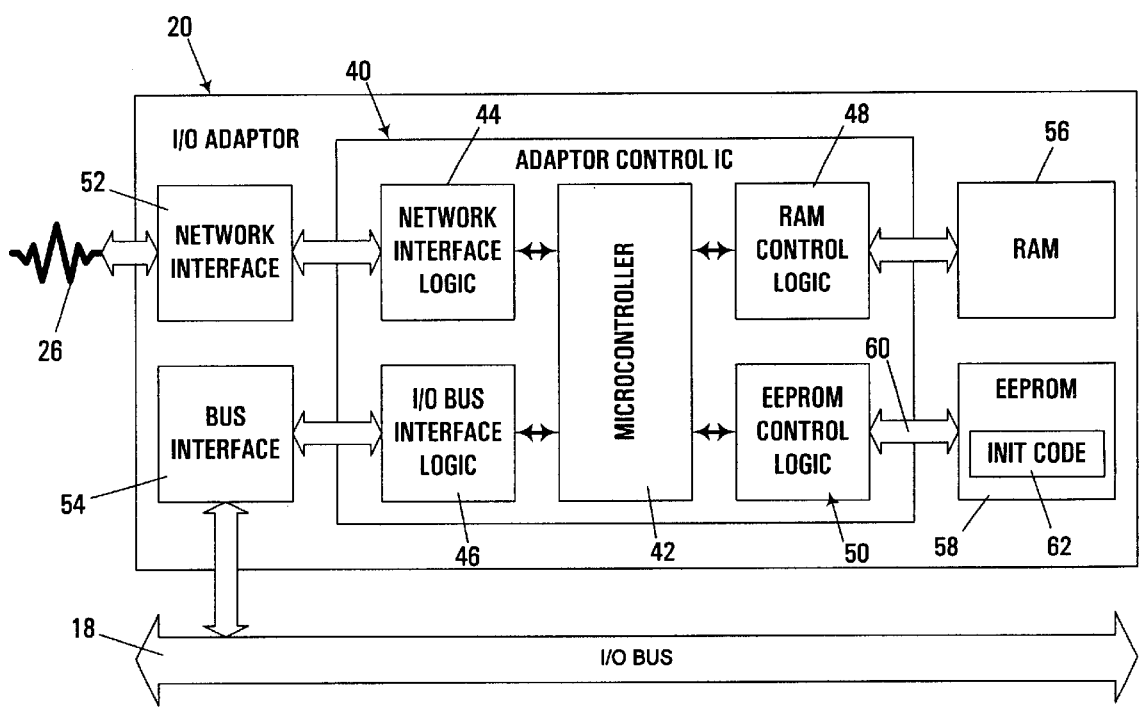
FIG. 2 is a block diagram of the input/output adaptor in the data processing system of FIG. 1.

In the illustrated embodiment, dynamic memory testing is incorporated into input/output adaptor 20, which is illustrated in greater detail as an input/output adaptor card in FIG. 2. For example, adaptor 20 may be based upon an Asynchronous Transfer Mode (ATM) network adaptor (available, for example, from International Business Machines Corporation) utilized in interconnecting an AS/400 midrange computer with an ATM network.

Adaptor 20 is shown including an adaptor control integrated circuit device 40, incorporating a microcontroller 42, network interface logic block 44, input/output bus interface logic block 46, random access memory (RAM) control logic block 48 and a non-volatile memory control logic block (implemented here as electrically erasable programmable read only memory (EEPROM) control logic block 50).

Block 44 interfaces adaptor 20 with external network 26 through a network interface block 52, which implements via one or more electronic components the physical interface between the adaptor and the external network. Similarly, block 46 interfaces adaptor 20 with system input/output bus 18 through an I/O bus interface block 54, which implements via one or more electronic components the physical interface between the adaptor and the system I/O bus. Moreover, block 48 provides a memory interface with one or more on-board random access memory devices such as dynamic random access memory (DRAM) devices, providing a working memory for the adaptor.

It will be appreciated that the particular implementations of blocks 42–58 and 52–56 will vary depending upon the particular protocols utilized in the particular network and I/O bus architectures being interfaced by the adaptor. Moreover, the general operation of a network adaptor is well understood in the art, and thus the implementation of such blocks is well within the ability of one of ordinary skill in the art having the benefit of the instant disclosure.

Dynamic memory testing consistent with the invention is implemented in EEPROM control logic block 50, which is interfaced with a non-volatile memory 58 (here, one or more EEPROM memory devices) through a control bus 60. Stored within non-volatile memory 58 is initialization program code 62, which is retrieved by block 50 and executed by microcontroller 42 to initialize the adaptor to a known operational state.

It will be appreciated that dynamic memory testing consistent with the invention may be utilized in connection with other forms of non-volatile memory, including, for example, various read-only memory (ROM) solid state storage devices such as programmable read-only memories (PROM's) and electrically programmable read-only memories (EPROM's), as well as other non-volatile solid state devices such as flash memory devices. Moreover, the precise initialization program code stored in memory 58 will be tailored for execution by microcontroller 42 to initialize the adaptor; however, the precise program code utilized to implement this functionality is irrelevant to an understanding of the invention.

Figure 3:
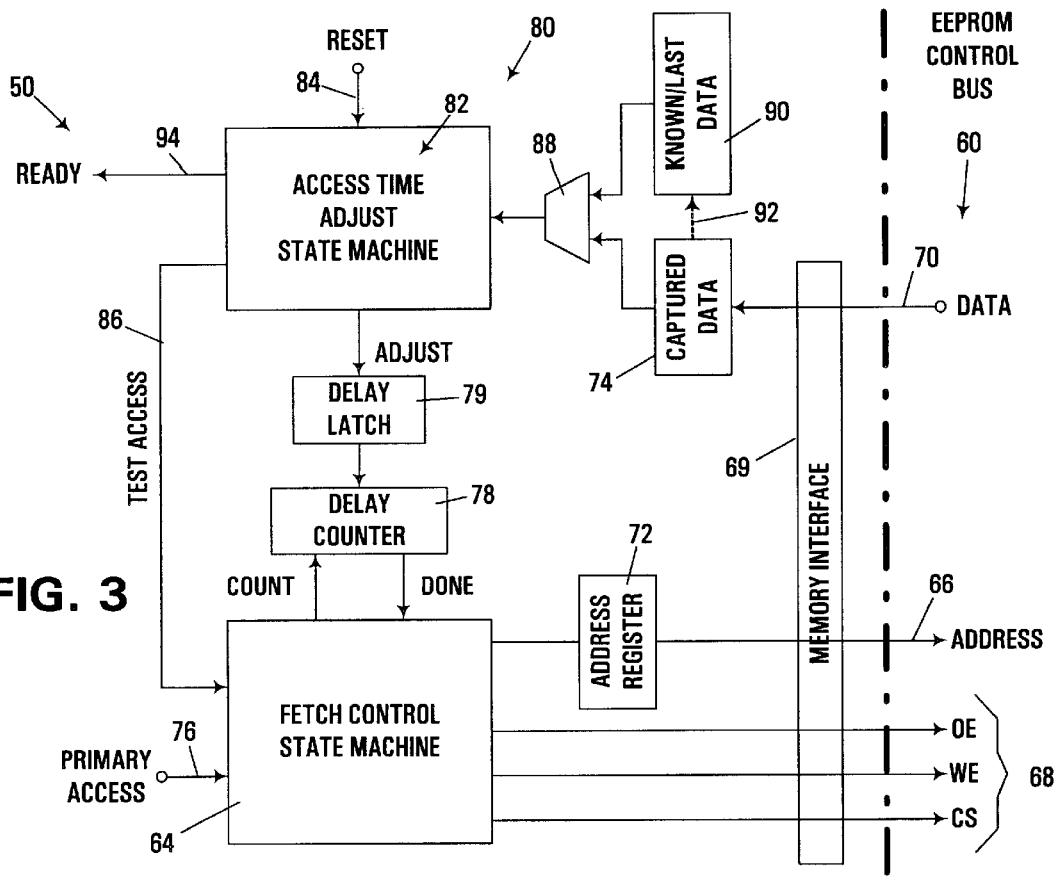
FIG. 3 is a block diagram of the non-volatile memory control logic in the input/output adaptor of FIG. 2.

Now turning to FIG. 3, the primary functional components in non-volatile memory control logic block 50 are shown in greater detail. Specifically, a fetch control state machine 64 in block 50 is illustrated as interfacing with control bus 60 through a memory interface 69 for the purpose of retrieving initialization program code from non-volatile memory 58. Memory interface 69 generally represents the points of interconnect (e.g., buffers/drivers) between block 50 and control bus 60, the configuration of which is well known in the art.

Memory 58 is driven by asserting an address across address lines 66 (via address register 72) and controllably asserting a series of control signals 68 (including one or more output enable (OE) lines, write enable (WE) lines and chip select (CS) lines. Data is retrieved from the non-volatile memory over a series of data lines 70, and stored in a captured data register 74 for forwarding to microcontroller 42 (the interface with which is not shown in FIG. 3). In the illustrated implementation, the non-volatile memory is a read-only memory, and as such, data lines 70 are unidirectional. In other embodiments where a writable non-volatile memory is used, a mechanism for forwarding data to the memory may also be supplied.

Fetch control state machine 74 is principally responsive to an access request supplied by the microcontroller over a primary access port 76, specifying a memory address from which data is to be fetched. The specific configuration and protocol utilized over access port 76 will depend upon the specific implementation of the microcontroller, and is not important for an understanding of the invention.

State machine 74 is configured to operate according to the specific protocol expected by the non-volatile memory. Consistent with the specific protocol, address lines 66 and the various control signals 68 are asserted as appropriate, with the time that such lines are asserted being controlled by a delay counter 78 interfaced with fetch control state machine 74. The delay counter is configured to initiate counting a predetermined number of clock cycles upon assertion of a "count" signal by state machine 74, and thereafter assert back to the state machine a "done" signal when the desired number of clock cycles have passed. The number of clock cycles to count is stored in a delay register 79 accessible by the counter.

It will be appreciated that counter 78 may be implemented in a number of manners consistent with the invention. For example, counter 78 may be configured to initially latch the value stored in latch 79 in response to the "count" signal and thereafter decrement each clock cycle until a "zero" count is reached, whereby the counter asserts the "done" signal back to the state machine. As another example, counter 78 may be reset to a "zero" count upon assertion of the "count" signal, and thereafter increment each clock cycle until a comparator determines the count is equal to the value stored in latch 79, whereby the counter asserts the "done" signal back to the state machine. Other implementations will be apparent to one of ordinary skill in the art having the benefit of the instant disclosure.

It will also be appreciated that the implementation of state machine 74 in handling a specific interface protocol with non-volatile memory 58 is well within the ability of one of ordinary skill in the art, and will vary for different memories. Moreover, other implementations of the fetch logic may be utilized in the alternative. For example, rather than using a delay counter, a variable length pipeline could be utilized, with the number of stages controlled by the value stored in latch 79. Other modifications will be apparent to one of ordinary skill in the art.

Control of the operational access time for the non-volatile memory (that is, the number of clock cycles to assert the address lines and control signals for any given fetch operation) is handled through setting the delay latch 79 to equal the number of clock cycles for the desired operational access time. The setting of this value to implement dynamic memory testing is handled by a dynamic test circuit 80, incorporating an access time adjust state machine 82.

State machine 82 is responsive to a reset signal applied at 84, generated either during a hard (power on) or soft reset. To perform dynamic testing consistent with the invention, state machine 82 supplies one or more test accesses to fetch control state machine 64 over lines 86. The configuration of lines 86 and the specific protocol used will typically be similar to that used on primary access port 76. Moreover, rather than utilizing a separate access port for test accesses, such test accesses may be supplied via primary access port 76 in other embodiments, such that a test access is handled in the same manner as any other access request to the non-volatile memory control logic.

Test accesses are utilized by state machine 82 to determine whether a given access time results is satisfactory for use with the particular non-volatile memory interfaced over bus 60. To do so, state machine 82 supplies an "adjust" signal to delay latch 79 to vary the delay count stored in the latch. Depending upon the particular implementation of latch 79, the "adjust" signal may incorporate an increment or decrement signal, or may contain the actual delay count to be stored in the latch.

To analyze the results of test accesses made using the delay count stored in latch 79, the state machine receives a compare signal output by a comparator 88. One input to the comparator is the data value returned by the non-volatile memory in response to an access request and latched in captured data register 74. The other input to the comparator is supplied by a test register 90.

A test access consistent with the invention may utilize a number of operations to test the ability of a non-volatile memory to operate with a given operational access time. In one embodiment, for example, a test access incorporates a single access request to a specific memory address in the non-volatile memory that contains a known data value. In such an embodiment, register 90 stores the expected data value, such that a successful access occurs when the retrieved data value equals that stored in register 90. For such an implementation, register 90 may either be programmable, or may be hardwired with the known value.

In another embodiment, a test access may incorporate two successive access requests to the same memory address in the non-volatile memory, with the results of the two accesses compared to verify whether the same data value was returned for each access. In such an implementation, register 90 stores the result of the first access request, via an interface 92 with register 74.

Figure 4:
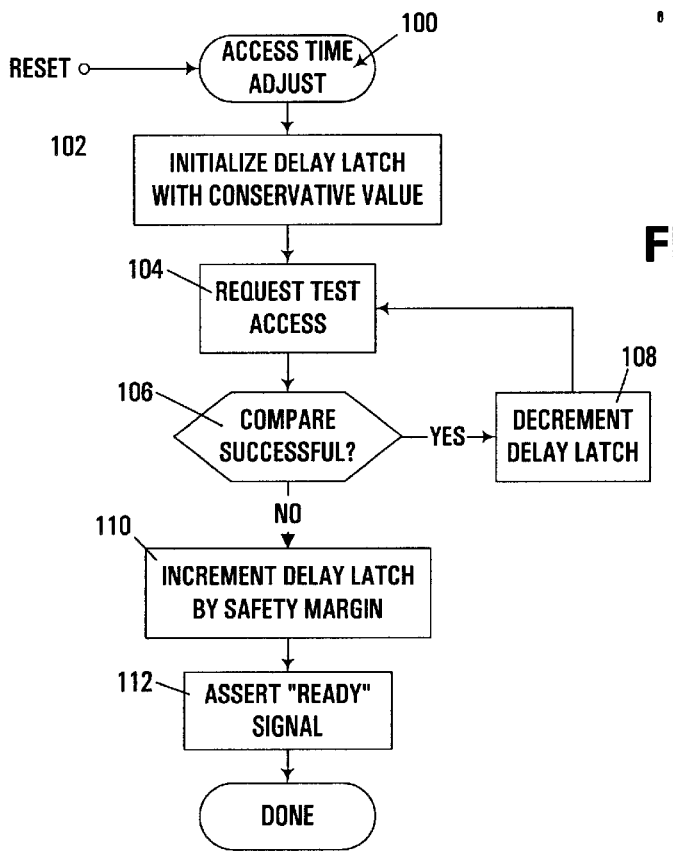
FIG. 4 is a flowchart illustrating the program flow of an access time adjust routine executed by the memory control logic of FIG. 3.

In some embodiments, it may also be desirable to signal completion of dynamic testing to the microcontroller, thereby alerting the microcontroller that retrieval of the initialization program code may commence. While various alternate manners of alerting the microcontroller may be used, it may be sufficient for state machine 82 to simply assert a "ready" signal 94 to the microcontroller upon completion of testing. To implement dynamic memory testing consistent with the invention, state machine 82 is configured to perform at least one test access with the non-volatile memory to determine a satisfactory access time at which the non-volatile memory successfully handles a memory access request. One sequence of operations suitable or implementation in state machine 82 is represented by access time adjust routine 100 of FIG. 4. Routine 100 is initiated in response to assertion of the "reset" signal, and begins in block 102 by initializing the delay latch with a conservative value for the sample access time, typically representative of an access time that is somewhat longer than that for any non-volatile memory that it is expected may be used with the adaptor. Once the delay latch is set with the conservative value, a test access is requested in block 104, e.g., by attempting to fetch known data from a specific memory location, or by initiating a double sample of the same memory location.

Block 106 then determines whether the output of comparator 88 indicates a successful test access (i.e., a match between the data in registers 74 and 90). If so, control passes to block 108 to decrement the value stored in the delay latch by one or more clock cycles. Control then returns to block 104 to initiate another test access, now using a shorter sample access time.

Blocks 104–108 therefore progressively decrement the value stored in delay latch 79 until an unsuccessful test access (where the contents of registers 74 and 90 do not match) is detected in block 106. Once this occurs, an unsatisfactory access time is associated with the value stored in latch 79. Control therefore passes to block 110 to increment the contents of the latch by a desired safety margin (e.g., two clock cycles) to arrive at a suitable operational access time. Control then optionally passes to block 112 to assert the "ready" signal to indicate the completion of dynamic testing, whereby routine 100 is then complete.

It will be appreciated that the implementation of routine 100 in a state machine is well within the ability of one of ordinary skill in the art having the benefit of the instant disclosure. Moreover, various modifications may be made to routine 100. For example, it may be desirable to incorporate storage of the delay latch value representing the last satisfactory access time at which a successful compare was found. In such an alternate implementation, addition of a safety margin could be omitted.

Also, it may be desirable in other embodiments to start with an access time well below any anticipated satisfactory access time, and then progressively increase the value stored in the delay latch until a successful test access occurs. In such an implementation, addition of a safety margin would be optional.

As another alternative, if it is known that the adaptor may utilize only a fixed number of different types of non-volatile memories, only a few datapoints corresponding to satisfactory access times expected for the various types of non-volatile memories may be tested, rather than progressing through a purely linear sequence of test datapoints.

Various additional modifications may be made to the illustrated embodiments without departing from the spirit and scope of the invention. Therefore, the invention lies in the claims hereinafter appended.

What is claimed is:

1. A method of initializing an electronic device of the type including a solid state non-volatile memory within which is stored initialization program code, the method comprising:
   (a) dynamically testing the non-volatile memory by performing at least one test access to the non-volatile memory to determine a satisfactory access time at which the non-volatile memory correctly processes the test access; and
   (b) thereafter retrieving initialization program code from the non-volatile memory using an operational access time selected based upon the determined satisfactory access time.

2. The method of claim 1, wherein dynamically testing the non-volatile memory includes sequentially performing a plurality of test accesses to the non-volatile memory using progressively shorter sample access times until the non-volatile memory incorrectly processes a test access, wherein the satisfactory access time is equivalent to the last sample access time at which the non-volatile memory correctly processes a test access.

3. The method of claim 2, further comprising selecting the operational access time to equal the determined satisfactory access time.

4. The method of claim 1, wherein performing the test access includes:
   (a) performing a fetch from a predetermined memory location in the non-volatile memory to retrieve a data value stored at the predetermined memory location; and
   (b) comparing the fetched data value to an expected value.

5. The method of claim 1, wherein performing the test access includes:
   (a) performing first and second fetches from the same memory location in the non-volatile memory to respectively retrieve first and second data values; and
   (b) comparing the first and second values.

6. A method of initializing an electronic device of the type including a non-volatile memory within which is stored initialization program code, the method comprising:

(a) dynamically testing the non-volatile memory by performing at least one test access to the non-volatile memory to determine a satisfactory access time at which the non-volatile memory correctly processes the test access; and (b) thereafter retrieving initialization program code from the non-volatile memory using an operational access time selected based upon the determined satisfactory access time;

wherein the operational access time is selected by adding a margin to the determined satisfactory access time.

7. A circuit arrangement, comprising:

(a) a solid state non-volatile memory;

(b) initialization program code resident in the memory; and (c) memory control logic configured to dynamically test the non-volatile memory by performing at least one test access to the non-volatile memory to determine a satisfactory access time at which the non-volatile memory correctly processes the test access, the memory control logic further configured to thereafter retrieve initialization program code from the non-volatile memory using an operational access time selected based upon the determined satisfactory access time.

8. The circuit arrangement of claim 7, further comprising a controller coupled to the memory control logic and configured to execute the initialization program code.

9. The circuit arrangement of claim 7, wherein the memory control logic is configured to dynamically test the non-volatile memory by sequentially performing a plurality of test accesses to the non-volatile memory using progressively shorter sample access times until the non-volatile memory incorrectly processes a test access, wherein the satisfactory access time is equivalent to the last sample access time at which the non-volatile memory correctly processes a test access.

10. The circuit arrangement of claim 9, wherein the memory control logic is further configured to select the operational access time to equal the determined satisfactory access time.

11. The circuit arrangement of claim 7, wherein the memory control logic is configured to perform the test access by performing a fetch from a predetermined memory location in the non-volatile memory to retrieve a data value stored at the predetermined memory location, and compare the fetched data value to an expected value.

12. The circuit arrangement of claim 7, wherein the memory control logic is configured to perform the test access by performing first and second fetches from the same memory location in the non-volatile memory to respectively retrieve first and second data values, and comparing the first and second values.

13. An electronic device comprising the circuit arrangement of claim 7.

14. An input/output adaptor comprising the circuit arrangement of claim 7.

15. A computer comprising the circuit arrangement of claim 7.

16. A circuit arrangement, comprising:

(a) a non-volatile memory;

(b) initialization program code resident in the memory; and (c) memory control logic configured to dynamically test the non-volatile memory by performing at least one test access to the non-volatile memory to determine a satisfactory access time at which the non-volatile memory correctly processes the test access, the memory control logic further configured to thereafter retrieve initialization program code from the non-volatile memory using an operational access time selected based upon the determined satisfactory access time, wherein the memory control logic comprises:

(i) a fetch control state machine coupled to the non-volatile memory and configured to assert at least one memory control signal to the non-volatile memory to fetch a data value from a selected memory address; and (ii) a delay counter coupled to the fetch control state machine, the delay counter configured to count, responsive to a first control signal from the fetch control state machine, a predetermined number of clock cycles based upon the selected operational access time, and to thereafter assert a second control signal to the fetch control state machine upon completion of counting the predetermined number of clock cycles.

17. A circuit arrangement, comprising:

(a) a non-volatile memory;

(b) initialization program code resident in the memory; and (c) memory control logic configured to dynamically test the non-volatile memory by performing at least one test access to the non-volatile memory to determine a satisfactory access time at which the non-volatile memory correctly processes the test access, the memory control logic further configured to thereafter retrieve initialization program code from the non-volatile memory using an operational access time selected based upon the determined satisfactory access time;

wherein the memory control logic is further configured to select the operational access time by adding a margin to the determined satisfactory access time.

18. A circuit arrangement, comprising:

(a) a memory interface configured to interface with a solid state non-volatile memory within which is stored initialization program code; and (b) a memory control circuit configured to dynamically test the non-volatile memory by performing at least one test access to the non-volatile memory through the memory interface to determine a satisfactory access time at which the non-volatile memory correctly processes the test access, the memory control circuit further configured to thereafter retrieve initialization program code from the non-volatile memory using an operational access time selected based upon the determined satisfactory access time.

19. A program product, comprising a hardware definition program that defines the circuit arrangement of claim 18; and a signal bearing media bearing the hardware definition program.

20. The program product of claim 19, wherein the signal bearing media includes at least one of a transmission type media and a recordable media.

* * * * *